(12) United States Patent
Jeganathan et al.

(10) Patent No.: US 9,665,143 B2
(45) Date of Patent: May 30, 2017

(54) CONTEXTUAL PLATFORM POWER MANAGEMENT

(71) Applicant: Intel Corporation, Santa Clara, CA (US)

(72) Inventors: Nithyananda S. Jeganathan, Portland, OR (US); James W. Edwards, Hillsboro, OR (US); Kandasubramaniam K. Palanisamy, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 14/496,000

(22) Filed: Sep. 25, 2014

(65) Prior Publication Data

US 2015/0192976 A1 Jul. 9, 2015

Related U.S. Application Data

(60) Provisional application No. 61/924,062, filed on Jan. 6, 2014.

(51) Int. Cl.
*G06F 1/26* (2006.01)
*G06F 1/32* (2006.01)
(Continued)

(52) U.S. Cl.
CPC ............ *G06F 1/206* (2013.01); *G06F 1/3231* (2013.01); *B60H 2001/3255* (2013.01); *B60H 2001/3277* (2013.01); *B60H 2001/3282* (2013.01); *G06F 1/203* (2013.01); *H01L 21/76864* (2013.01); *Y02B 60/1275* (2013.01); *Y02B 60/1289* (2013.01)

(58) Field of Classification Search
CPC ...... H01L 21/76864; B60H 2001/3255; B60H 2001/3277; B60H 2001/3282; G06F 1/206; G06F 1/3231
See application file for complete search history.

(56) References Cited

U.S. PATENT DOCUMENTS 8,230,246 B1 * 7/2012 Sharkey ................ G06F 1/1626
345/158
8,972,762 B2 * 3/2015 DeLuca ................ G06F 1/3206
713/323

(Continued)

OTHER PUBLICATIONS

Myllymaki, et al., "Capacitive Recognition of the User's Hand Grip Position in Mobile Handsets," Progress in Electromagnetics Research B, vol. 22, 203-220, 2010, pp. 1-8.

(Continued)

*Primary Examiner* — Xuxing Chen
(74) *Attorney, Agent, or Firm* — Trop, Pruner & Hu, P.C.

(57) ABSTRACT

In an embodiment, an apparatus includes a processor including logic to determine from data received from one or more sensors, whether the apparatus is in physical contact with a user. The logic is further to set a power management policy of the apparatus based on a processor context, where the processor context is determined based at least in part on whether the apparatus is in physical contact with the user, and where the power management policy is used by the logic to determine a level of power consumption at which to operate the processor. Other embodiments are described and claimed.

20 Claims, 4 Drawing Sheets

(51) Int. Cl.
*G06F 1/20* (2006.01)
*B60H 1/32* (2006.01)
*H01L 21/768* (2006.01)

(56) References Cited

U.S. PATENT DOCUMENTS

| | | | | |
|---|---|---|---|---|
| 2009/0113228 A1* | 4/2009 | Mok | ................... | G06F 1/1632 713/323 |
| 2012/0057197 A1* | 3/2012 | Matsuda | ............... | G06F 3/1221 358/1.15 |
| 2013/0249852 A1* | 9/2013 | Lin | ..................... | G06F 3/0418 345/174 |
| 2014/0108832 A1* | 4/2014 | Yamaguchi | ............. | G06F 1/203 713/320 |
| 2015/0331462 A1* | 11/2015 | Atkinson | ................ | G06F 3/044 713/100 |
| 2016/0080020 A1* | 3/2016 | Lagnado | ............. | H04L 12/6418 455/522 |

OTHER PUBLICATIONS

Noopuran, "Proximity Sensing in Mobile Phones," www.cypress.com, Cypress Semiconductor, Jan. 31, 2014, pp. 1-10.
McConnel, "Smart proximity sensor distinguishes between human body and inert objects," http://www.eetimes.com/document.asp?doc_id=1317369, EE Times, Jul. 25, 2012, pp. 1-2.
United States Patent and Trademark Office "Utility Patent Application" U.S. Appl. No. 14/039,740, filed Sep. 27, 2013.

\* cited by examiner

CONTEXTUAL PLATFORM POWER MANAGEMENT

PRIORITY

This application claims priority to U.S. Provisional Patent Application No. 61/924,062 filed on Jan. 6, 2014 and entitled "Contextual Platform Power Management For Actively and Passively Cooled Systems," the content of which is hereby incorporated by reference.

TECHNICAL FIELD

Examples described herein are generally related to contextual power and thermal management of a computing device.

BACKGROUND

Advances in semiconductor processing and logic design have permitted an increase in the amount of logic that may be present on integrated circuit devices. As a result, computer system configurations have evolved from a single or multiple integrated circuits in a system to multiple hardware threads, multiple cores, multiple devices, and/or complete systems on individual integrated circuits. Additionally, as the density of integrated circuits has grown, the power requirements for computing systems (from embedded systems to servers) have also escalated. Furthermore, software inefficiencies, and its requirements of hardware, have also caused an increase in computing device energy consumption. In fact, some studies indicate that computing devices consume a sizeable percentage of the entire electricity supply for a country, such as the United States of America. As a result, there is a vital need for energy efficiency and conservation associated with integrated circuits. These needs will increase as servers, desktop computers, notebooks, Ultrabooks™, tablets, mobile phones, processors, embedded systems, etc. become even more prevalent (from inclusion in the typical computer, automobiles, and televisions to biotechnology).

DETAILED DESCRIPTION

Figure 1:
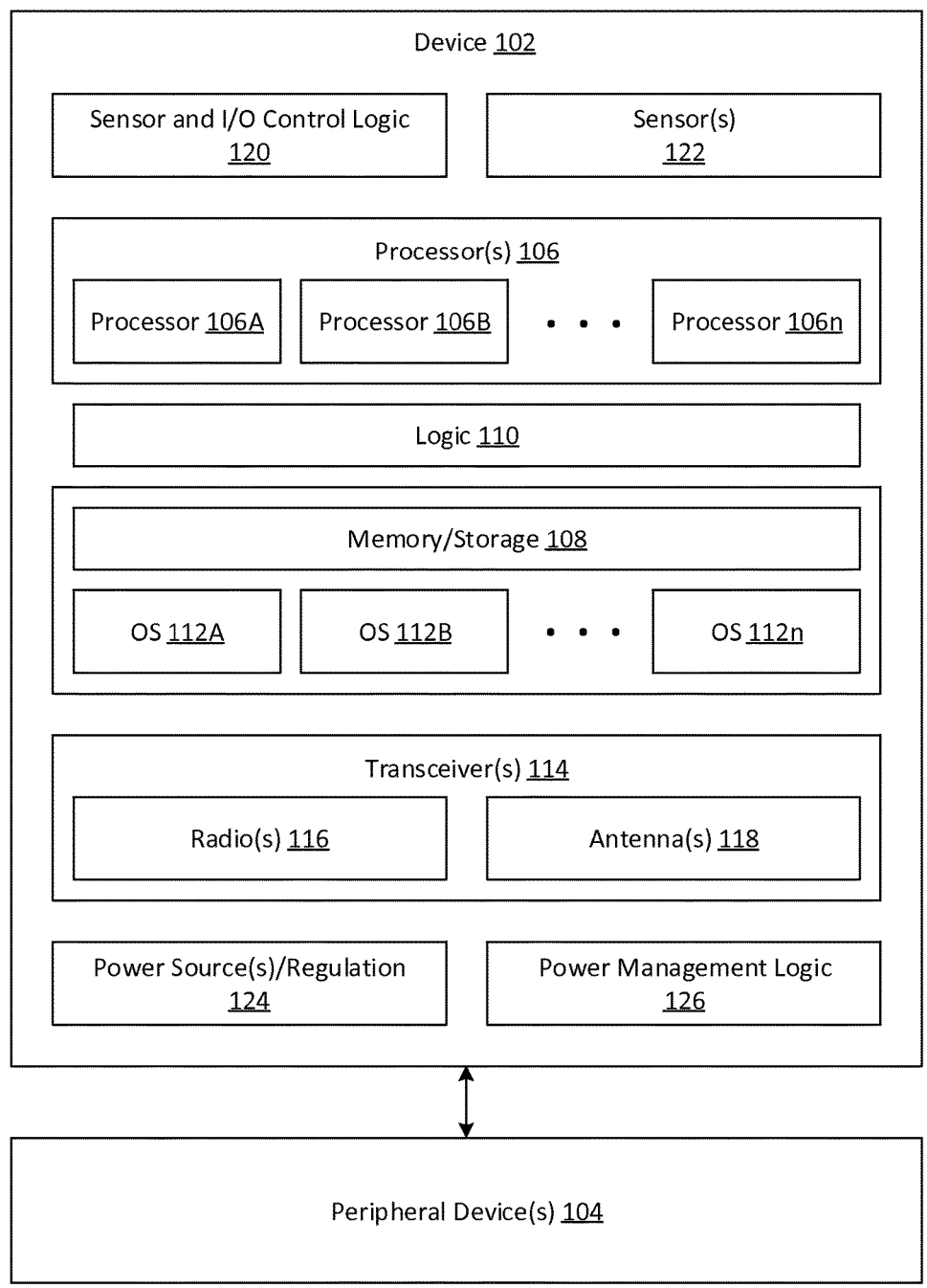
FIG. 1 is a block diagram of an apparatus, according to an embodiment of the present invention.

Power Management (PM) in systems, such as mobile systems, is a continuous and evolving process. Efficient management of platform resources while maximizing battery life is a goal of an efficient PM policy. A device context of a device (e.g., a portable device such as a mobile device) may be a representation of external factors that influence efficiency of the device. The external factors may be related to the device's thermal capability, e.g., ability of the device to dissipate heat. Device context may describe orientation of the device, presence or absence of physical contact of the device with a heat source (e.g., a user), presence or absence of proximate air flow that causes heat removal from the device (e.g., by convection), and other factors. Device context may be inferred from measurements, and may be evaluated to determine operating parameters of the device in order to achieve greater device efficiency and/or extend battery life.

In embodiments, a power management (PM) policy may be utilized to enhance an ability of a processor in a device to scale performance by selection of thermal constraints based on device context and usage. Device context may be determined through observation of platform states of components, sensors and usage parameters.

Embodiments are directed to contextual power management in devices such as mobile systems. In various embodiments, a mobile system may refer to one or more of a laptop computer, a tablet computer, a 2-in-1 device that generally combines functionality of a laptop with usability/portability of a tablet, a smartphone, a wearable device (such as a bracelet, ring, headset, etc.), or other mobile device. In some embodiments the mobile system may include more than one of the aforementioned devices, e.g., multiple devices that are coupled and that may create an improved user experience.

With general reference to notations and nomenclature used herein, the description that follows may be presented in terms of program procedures executed on a computer or network of computers. These procedural descriptions and representations may be used by those skilled in the art to convey their work to others skilled in the art.

A procedure is generally conceived to be a self-consistent sequence of operations performed on electrical, magnetic or optical signals capable of being stored, transferred, combined, compared, and otherwise manipulated. These signals may be referred to as bits, values, elements, symbols, characters, terms, numbers, or the like. It should be noted, however, that all of these and similar terms are to be associated with the appropriate physical quantities and are merely convenient labels applied to those quantities.

Further, the manipulations performed are often referred to in terms such as adding or comparing, which operations may be executed by one or more machines. Useful machines for performing operations of various embodiments may include general-purpose digital computers or similar devices. Various embodiments also relate to apparatus or systems for performing these operations. This apparatus may be specially constructed for a purpose, or it may include a general-purpose computer as selectively activated or reconfigured by a computer program stored in the computer. The procedures presented herein are not inherently related to a particular computer or other apparatus. Various general-purpose machines may be used with programs written in accordance with teachings herein, or it may prove convenient to construct more specialized apparatus to perform methods described herein.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives consistent with the claimed subject matter.

FIG. 1 is a block diagram of an apparatus, according to an embodiment of the present invention. While referred to hereinafter as a device 102 for purposes of simplicity and illustration, it should be understood that the device 102 may include any suitable name, label, configuration and/or form factor and still fall within the described embodiments.

The device 102 may include a system having a compact form factor arranged to support a plurality of computing components. As described herein, the device 102 may include any mobile computing device that can be carried or worn by a person (e.g., a user). In different embodiments, the device 102 may be a laptop, a tablet, a 2-in-1 device, a smartphone, a phone/tablet, a wearable device (such as a bracelet, necklace, earring, ring, earpiece, glasses, head-mounted device, etc.), or one or more other mobile-style devices. While described herein as being within this list, one skilled in the art will understand that embodiments are not limited in this respect.

The device 102 may include one or more processor circuits 106 (also referred to as processor logic(s), processor core(s), etc.) (e.g. processor 106A, processor 106B, and processors through processor 106n, where n is a total count of processors), memory/storage 108, logic 110, operating systems (OSs) 112 (e.g. OS 112A and OS 112B, and OSs through OS 112m, where m is a total count of OSs), transceiver(s) that can include 114, radio(s) 116 and antenna(s) 118, sensor and input/output (I/O) control logic (SICL) 120, sensor(s) 122, power source/regulation 124, and power management logic 126. Although the device 102 shown in FIG. 1 has a limited number of elements in a certain topology, it may be appreciated that the device 102 may include more or less elements in alternate topologies as desired for a given implementation.

In various embodiments, device 102 may include the processor circuit 106. The processor circuit 106 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Core (2) Quad®, Core i3®, Core i5®, Core i7®, Atom®, Itanium®, Pentium®, Xeon®, and XScale® processors; and similar processors. Dual microprocessors, multi-core processors, and other multi-processor architectures may also be employed as the processor circuit 106.

As shown in FIG. 1, in some embodiments, device 102 may include two processor circuits 106A and 106B, or may include any number of processor circuits. In other embodiments, the processor circuits 106A, 106B, . . . , 106n may include separate cores of a multi-core processor 106. The embodiments are not limited in this respect.

In some embodiments, the one or more processor circuits 106A, 106B may include a first processor circuit 106A arranged to execute a first operating system 112A and a second processor circuit 106B arranged to execute a second operating system 112B (and potentially any number (n) of additional operating systems that are to be executed on additional processor circuits). In various embodiments, the logic 110 may be operative to automatically select one of the first processor circuit 106A and first operating system 112A or second processor circuit 106B and second operating system 112B based on the one or more characteristics of peripheral device 104 (e.g., context), as described in more detail below.

The first processor circuit 106A may operate at a first frequency and the second processor circuit 106B may operate at a second frequency that is less than the first frequency in some embodiments. For example, the first processor circuit 106A may include a core capable of executing an operating system 112A, such as an Android® operating system, iOS operating system, OS X operating system, Linux operating system, Windows® operating system or any other suitable operating system. Processor circuit 106B may include a low power, low frequency processor circuit such as a microcontroller (MCU) or the like. Processor circuit 106B may be operative to execute a boot OS, real-time OS (RTOS), run-time OS or limited functionality OS 112B that is designed for a specific purpose, application or device. The embodiments are not limited in this respect.

In various embodiments, device 102 may include a memory unit 108. The memory unit 108 may store, among other types of information, logic 110 and OS 112A, OS 112B, etc. The memory unit 108 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. While shown as being included with memory 108 in FIG. 1, it should be understood that logic 110 and/or OS 112A, 112B may be located elsewhere within device 102 and still fall within the described embodiments.

In some embodiments, device 102 may include logic 110. Examples of logic 110 may include but are not limited to executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein. In some embodiments, at least a portion of logic 110 is implemented in hardware. Other embodiments are described and claimed.

Device 102 may include a power source and/or power regulation (PSPR) 124 in various embodiments. In some embodiments, PSPR 124 may include a battery such as a lithium ion battery or the like. In some embodiments, PSPR 124 also may include one or more voltage regulators to regulate the voltage supplied by the power source. PSPR 124 may be operative to provide power to one or more of the components of device 102. The embodiments are not limited in this respect.

In various embodiments, device 102 may include sensor and I/O control logic (SICL) 120. SICL 120 may include a plurality of input/output (I/O) pins or ports in some embodiments, and may also include logic to interface with one or more sensors 122. Sensors 122 may include accelerometers, gyroscopes, inclinometers, global position system (GPS) receivers, infrared, RADAR, LIDAR, biometric, thermal, environmental, proximity, barometric, pressure sensors, and may include one or more specific absorption rate (SAR) sensors. For example, the SICL 120 may be operative to interface with one or more peripheral I/O devices as well as with one or more sensors and to report sensor and I/O information to the processor 106. In various embodiments, the SICL 120 may be operative to enable (or arranged to support) plug and play operation between the device 102 and a plurality of other devices.

In operation one or more of the sensors, e.g., a SAR sensor within the SICL 120 may be operable to detect that either a human being (e.g., a user of the device 102), or a non-heat producing object, e.g., wood, air, etc., is in physical contact with the device 102. Physical contact of the device 102 with the human being may imply that heat is being transferred from the human being to the device 102. Responsive to an indication of physical contact of the human being with the device 102, operating parameters, e.g., operating speed of one or more of the processors 106, may be adjusted (e.g., reduced) to compensate for heat that flows from the human being to the device 102, to maintain a viable operating temperature.

Additionally, SICL 120 may include logic (e.g., software logic, hardware logic, or a combination of both) to dynamically configure the device 102 to interface with one of a number of peripheral devices 104. A pin-out of device 102 is not hardwired in many embodiments and instead can be programmed. This dynamic programmability may be based on a discovery protocol that determines the pin-out of the peripheral device 104 interface upon being coupled to the peripheral device 104. For example, one or more pins may be set to corresponding discovery information for a plurality of other available pins in the interface. Once the device 102 retrieves this information, the device 102 may program capabilities of pins on the device 102 for further interface compatibility with the peripheral device 104. In other embodiments, each pin on the device 102 may check for a live link to determine which pins are available for interfacing.

Because this is a dynamic configuration, the device pins may change functionality and/or operational state depending on the type of peripheral device 104 interface available. The functionality of a given pin may even change while maintaining a plugged in state with a single peripheral device 104 in some embodiments. Other embodiments are described and claimed.

Device 102 may include one or more wireless transceivers 114, in some embodiments. Each of the wireless transceivers 114 may be implemented as physical wireless adapters or virtual wireless adapters, sometimes referred to as "hardware radios" and "software radios," respectively. A single physical wireless adapter may be virtualized (e.g., using software) into multiple virtual wireless adapters. A physical wireless adapter typically connects to a hardware-based wireless access point. A virtual wireless adapter typically connects to a software-based wireless access point, sometimes referred to as a "SoftAP." For instance, a virtual wireless adapter may allow ad hoc communications between peer devices, such as a smart phone and a desktop computer or notebook computer. Various embodiments may use a single physical wireless adapter implemented as multiple virtual wireless adapters, multiple physical wireless adapters, multiple physical wireless adapters each implemented as multiple virtual wireless adapters, or some combination thereof. The embodiments are not limited in this case.

The wireless transceivers 114 may include or implement various communication techniques to allow the device 102 to communicate with other electronic devices. For instance, the wireless transceivers 114 may implement various types of standard communication elements designed to be interoperable with a network, such as one or more communications interfaces, network interfaces, network interface cards (NIC), radios, wireless transmitters/receivers (transceivers), wired and/or wireless communication media, physical connectors, and so forth.

By way of example, and not limitation, communication media includes wired communications media and wireless communications media. Examples of wired communications media may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other wireless media.

In various embodiments, the device 102 may implement different types of wireless transceivers 114. Each of the wireless transceivers 114 may implement or utilize a same or different set of communication parameters to communicate information between various electronic devices. In one embodiment, for example, each of the wireless transceivers 114 may implement or utilize a different set of communication parameters to communicate information between device 102 and any number of other devices. Some examples of communication parameters may include without limitation a communication protocol, a communication standard, a radio-frequency (RF) band, a radio, a transmitter/receiver (transceiver), a radio processor, a baseband processor, a network scanning threshold parameter, a radio-frequency channel parameter, an access point parameter, a rate selection parameter, a frame size parameter, an aggregation size parameter, a packet retry limit parameter, a protocol parameter, a radio parameter, modulation and coding scheme (MCS), acknowledgement parameter, media access control (MAC) layer parameter, physical (PHY) layer parameter, and any other communication parameters affecting operations for the wireless transceivers 114. The embodiments are not limited in this context.

In various embodiments, the wireless transceivers 114 may implement different communication parameters offering varying bandwidths, communications speeds, or transmission range. For instance, a first wireless transceiver may include a short-range interface implementing suitable communication parameters for shorter range communications of information, while a second wireless transceiver may include a long-range interface implementing suitable communication parameters for longer range communications of information.

In various embodiments, the terms "short-range" and "long-range" may be relative terms referring to associated communications ranges (or distances) for associated wireless transceivers 114 as compared to each other rather than an objective standard. In one embodiment, for example, the term "short-range" may refer to a communications range or distance for the first wireless transceiver that is shorter than a communications range or distance for another wireless transceiver 114 implemented for the device 102, such as a second wireless transceiver. Similarly, the term "long-range" may refer to a communications range or distance for the second wireless transceiver that is longer than a communications range or distance for another wireless transceiver 114 implemented for the device 102, such as the first wireless transceiver. The embodiments are not limited in this context.

In various embodiments, the terms "short-range" and "long-range" may be relative terms referring to associated communications ranges (or distances) for associated wireless transceivers 114 as compared to an objective measure, such as provided by a communications standard, protocol or interface. In one embodiment, for example, the term "short-range" may refer to a communications range or distance for the first wireless transceiver that is shorter than 300 meters or some other defined distance. Similarly, the term "long-range" may refer to a communications range or distance for the second wireless transceiver that is longer than 300 meters or some other defined distance. The embodiments are not limited in this context.

In one embodiment, for example, the wireless transceiver 114 may include a radio designed to communicate information over a wireless personal area network (WPAN) or a wireless local area network (WLAN). The wireless transceiver 114 may be arranged to provide data communications functionality in accordance with different types of lower range wireless network systems or protocols. Examples of suitable WPAN systems offering lower range data communication services may include a Bluetooth system as defined by the Bluetooth Special Interest Group, an infra-red (IR) system, an Institute of Electrical and Electronics Engineers (IEEE) 802.15 system, a DASH7 system, wireless universal serial bus (USB), wireless high-definition (HD), an ultra-side band (UWB) system, and similar systems. Examples of suitable WLAN systems offering lower range data communications services may include the IEEE 802.xx series of protocols, such as the IEEE 802.11a/b/g/n series of standard protocols and variants (also referred to as "WiFi"). It may be appreciated that other wireless techniques may be implemented, and the embodiments are not limited in this context.

In one embodiment, for example, the wireless transceiver 114 may include a radio designed to communicate information over a wireless local area network (WLAN), a wireless metropolitan area network (WMAN), a wireless wide area network (WWAN), or a cellular radiotelephone system. Another wireless transceiver may be arranged to provide data communications functionality in accordance with different types of longer range wireless network systems or protocols. Examples of suitable wireless network systems offering longer range data communication services may include the IEEE 802.xx series of protocols, such as the IEEE 802.11a/b/g/n series of standard protocols and variants, the IEEE 802.16 series of standard protocols and variants, the IEEE 802.20 series of standard protocols and variants (also referred to as "Mobile Broadband Wireless Access"), and so forth. Alternatively, the wireless transceiver 180-2 may include a radio designed to communication information across data networking links provided by one or more cellular radiotelephone systems. Examples of cellular radiotelephone systems offering data communications services may include GSM with General Packet Radio Service (GPRS) systems (GSM/GPRS), CDMA/1xRTT systems, Enhanced Data Rates for Global Evolution (EDGE) systems, Evolution Data Only or Evolution Data Optimized (EV-DO) systems, Evolution For Data and Voice (EV-DV) systems, High Speed Downlink Packet Access (HSDPA) systems, High Speed Uplink Packet Access (HSUPA), and similar systems. It may be appreciated that other wireless techniques may be implemented, and the embodiments are not limited in this context.

Although not shown, device 102 may further include one or more device resources commonly implemented for electronic devices, such as various computing and communications platform hardware and software components typically implemented by a personal electronic device. Some examples of device resources may include without limitation a co-processor, a graphics processing unit (GPU), a chipset/ platform control logic, an input/output (I/O) device, computer-readable media, network interfaces, portable power supplies (e.g., a battery), application programs, system programs, and so forth. The embodiments, however, are not limited to these examples.

In the illustrated embodiment shown in FIG. 1, the processor(s) 106 may be communicatively coupled to one or more of the memory 108, logic 110, power source 112, transceiver 114, radio 116, antenna 118 and/or SICL 120. The memory unit 108 may store the logic 110 arranged for execution by the processor 106 to enable processing capabilities. The logic 110 may generally provide features to enable any of the functionality described herein. Other embodiments are described and claimed.

The peripheral device 104 may include, for example, an I/O peripheral device designed to interact with device 102. In some embodiments, the I/O devices may include but are not limited to display, speaker, microphone, projector, camera, keyboard, one or more additional input devices (such as a touchpad, touchscreen), and one or more sensors (such as an accelerometer, gyroscope, global positioning system (GPS) logic, Infrared motion detector, etc.). Although the peripheral device 104 shown in FIG. 1 has a number of elements in a certain topology, it may be appreciated that the peripheral device 104 may include more or less elements in alternate topologies as desired for a given implementation. For example, any number, type or arrangement of an I/O device, including devices not shown in FIG. 1, could be used and still fall within the described embodiments.

The one or more I/O devices may be arranged to provide functionality to the peripheral device 104 and/or the device 102 including but not limited to capturing images, exchanging information, capturing or reproducing multimedia information, receiving user feedback, or any other suitable functionality. Non-limiting examples of input/output devices include a camera, QR reader/writer, bar code reader, buttons, switches, input/output ports such as a universal serial bus (USB) port, touch-sensitive sensors, pressure sensors, a touch-sensitive digital display and the like. The embodiments are not limited in this respect.

The peripheral device 104 may include one or more displays in some embodiments. The displays may include any digital display device suitable for an electronic device. For instance, the displays may be implemented by a liquid crystal display (LCD) such as a touch-sensitive, color, thin-film transistor (TFT) LCD, a plasma display, a light emitting diode (LED) display, an organic light emitting diode (OLED) display, a cathode ray tube (CRT) display, or other type of suitable visual interface for displaying content to a user of the device 102 when used in connection with the device 102. The displays may further include some form of a backlight or brightness emitter as desired for a given implementation.

In various embodiments, the displays may include touch-sensitive or touchscreen displays. A touchscreen may include an electronic visual display that is operative to detect the presence and location of a touch within the display area or touch interface. In some embodiments, the display may be sensitive or responsive to contact of the display with a finger or hand. In other embodiments, the display may be operative to sense other passive objects, such as a stylus or electronic pen. In various embodiments, displays may enable a user to interact directly with what is displayed, rather than indirectly with a pointer controlled by a mouse or touchpad. Other embodiments are described and claimed.

While not limited in this respect, in some embodiments the device 102 may include one or more of a wearable device, a control device, a display device, an audio/video (A/V) device, a toy device such as a remote control car or a robot device. For example, the device may include a smartwatch device, a TV remote control device, a smart speaker, etc. One skilled in the art will understand that any suitable device could be arranged as a peripheral device 104 to accommodate device 102 and, as such, the embodiments are not limited to the examples described herein.

In some embodiments, the peripheral device 104 may include a dumb device. More particularly, the device itself may not include components as shown in FIG. 1 as forming part of device 102. For example, peripheral device 104 may not include its own processor, memory, power source, transceiver, etc. Instead, the peripheral device 104 may rely on a device like device 102 for power and processing capabilities. In this manner, any number of peripheral devices could be produced inexpensively and each could be powered and provided with computing capabilities by a common device. Other embodiments are described and claimed. While not shown herein, in some embodiments the device may include or include an independent power supply (e.g. separate and distinct from the power supply of the device) that may power one or more of the components of the peripheral device 102 and/or one or more components of the device 102. Other embodiments are described and claimed.

In embodiments, device 102 may include power management logic 126. The power management logic 126 may include hardware circuitry, software application(s), firmware code, or a combination of two or more of the above types of logic. Power management logic 126 may determine a power state of the device 102, including the processor 106 and potentially other components within device 102. Power management logic 126 may utilize many different inputs to determine a context of the device 102. Context of the device may be considered in determining a power management policy, e.g., what power state/condition/level (e.g., wake/sleep state) each component is to be in at any given time.

Power management logic 126 may utilize sensor input from sensor(s) 122 and SICL 120, activity levels from a user or from other applications running on an OS such as OS 112A, among other inputs to determine the context of the device.

In embodiments, device context-based power management (PM) is described. Device context may refer to a combination of device position (e.g., vertical, horizontal, horizontal with air flow, vertical with air flow), device contact state (e.g., whether the device is free from human contact or in physical contact with a human), and docking state (whether or not the device is docked, and whether active cooling is being provided). Different device contexts may influence device platform thermal constraints. The PM policy may react to the device context changes and may manage power and thermal state decisions, e.g., to enhance processor performance. Additionally, a device context-based PM infrastructure may monitor performance and power consumption of software applications and may offer suggestions (e.g., via a user interface) to an end user, e.g., to improve performance or battery life of the platform. Additionally, the user interface may provide to the user an indication of whether the performance or the battery life of the platform is improved responsive to user-executed changes to the device context, e.g., change in device orientation, contact with a human being, proximity to active cooling, flow rate of a coolant proximate to the device, etc. For example, the user interface may include a color indicator that may correspond to a thermal characteristic of the device, e.g., operating temperature of a processor of the device.

The device platform may have a thermal dissipation limit (TDP), e.g., a high temperature operating characteristic of the device 102 that is typically higher than a temperature of an exterior (skin) of the device ($T_{skin}$). By relaxing the $T_{skin}$, e.g., to enable $T_{skin}$ to exceed determined constraints, higher performance may be extracted from the system. By utilizing device contextual information to determine whether to relax $T_{skin}$, the PM policy may improve the performance of the system.

Modern processors may have significant performance scaling. For instance, many processors can deliver significantly higher performance than their nominal performance level if the thermal constraints of the platform can be increased from a configured TDP (cTDP).

Some workloads scale very well with an increase in platform cTDP. These workloads can benefit substantially from active cooling docks, different system orientations, etc. Contextual PM leverages the performance scalability of a processor and may result in significant performance gains, depending on the context of the device.

In embodiments, a current platform PM policy may be determined as follows:

$$\text{PM policy} = \text{function(device orientation, device contact state, dock state)}$$

Variables that are input to determine the PM policy may include, but are not limited to: device orientation, device contact state, device dock state (e.g., device avatar). Each of device orientation, device contact state, and device dock state is further described below.

Device Orientation: In embodiments, an orientation of the device may be utilized to help determine the PM policy. Device orientation with respect to an orientation standard (e.g., horizontal, vertical, gravitational vertical, or other orientation standard) may be inferred based on position sensors such as accelerometers, inclinometers, gyroscopes, etc. For example, the position sensors can provide information as to whether the device is substantially in a horizontal orientation or a vertical orientation with respect to an orientation standard. For instance, the device may be positioned horizontally on, e.g., a table or desk with no air flow to cool the device. In some embodiments, the device may be positioned horizontally or angled with respect to horizontal, and permitting airflow that enables some heat transfer to surrounding air.

In a vertical orientation, the device is positioned vertically due to, e.g., a user holding the device, or the device being leaned against a wall, or the device coupled to a dock, or by another means of positioning the device. The vertical orientation permits surrounding hot air to rise due to convection, e.g., between a core heat sink and a top-plate, and may enable heat to transfer from the processor to an exterior skin of the device.

In a vertical position with active cooling, the device may be attached to a dock or base with active cooling capability. Active cooling refers to, e.g., one or more fans, or a mechanism to circulate a heat conductive agent (e.g., gas or liquid) that can remove heat from the device, etc., to reduce $T_{skin}$ of the platform.

Device Contact State: Physical contact with a human being (e.g., user) may be inferred through analysis of data from one or more sensors such as a Specific Absorption Rate (SAR) sensor, accelerometer, gyro sensor, touch sensor, etc. The SAR sensor can output data indicating whether an object that is in close proximity to the sensor is human skin, or wood, air, etc. Some SAR sensors operate according to capacitive proximity measurement. An advantage of knowing whether or not a human is proximate is that when the human is not holding the device, $T_{skin}$ can be allowed to scale higher, permitting increased performance of the device.

Because a SAR sensor typically has a granularity of a few centimeters of accuracy, it may not be reliable to use as a sole sensor by which to determine whether the device is in close proximity/physical contact with a human being. Alternatively, a plurality of sensor measurements may be recorded from another sensor (e.g., an inclinometer that determines orientation with respect to an orientation standard) over a defined time period. Because it is very difficult for humans to hold an item still (e.g., at a fixed orientation) without moving or touching a device display screen, measurements recorded over time may be analyzed to determine whether the user is holding the device. For example, the measurements recorded may be data that includes a plurality of orientation measurements received from the inclinometer, each orientation measurement taken at a distinct time over a defined time period. The measurements may be recorded in serial fashion, e.g., periodically over the defined time period. The logic may determine whether the apparatus is in physical contact with the user based at least in part on a comparison of a standard deviation of the sensor measurements, to a threshold value, e.g. threshold standard deviation.

Alternatively, by receiving data from several sensors (e.g., two or more of SAR, accelerometer, inclinometer, gyroscope, etc.), physical proximity to a human may be able to be inferred with greater accuracy than from SAR data alone. For instance, data from each of two or more sensors may be evaluated, e.g., statistically using standard deviation of the respective data from each of the sensors, to infer whether there is physical contact between the device and a human (e.g., the user).

In some embodiments, sensor data may be received from a "virtual sensor," e.g., data received from several sensors (e.g., "fused sensors"), which in combination emulates another sensor. For example, sensor data received from an accelerometer, a gyroscope, and a compass may be analyzed statistically. In one embodiment, data received (e.g., periodically) from each of the fused sensors during a defined time period may be analyzed to determine a corresponding standard deviation. The standard deviations of each of the fused sensors, as determined by statistical analysis, may be combined and compared with an overall threshold, (e.g., an overall standard deviation threshold), to determine whether the device is being held by a human being.

Device Avatar (Dock state): Diverse instantiations of docks and peripheral devices may be available to a system to deliver enhanced user experience. By virtue of placing the device in a dock, the cTDP of the platform may change and with it, the scope to deliver contextual performance boost. Information on the type of dock (if any) attached, may be obtainable from an embedded controller (EC) on the platform. A dock with active cooling refers to a dock that has fans or other mechanisms to actively cool the platform by removing heat from the system. On docks with fans for active cooling, contextual PM policy may be able to adjust air speed (e.g., fan speed) dynamically, depending on platform requirements.

Two examples of fan control policies are described below.

In one example, fan speed of the dock can be increased linearly with performance requirements of a system. If the system is performing at close to full utilization, then fan speed can be ramped up to the maximum levels to support cooling of the platform. Fan speed of the dock can be adjusted depending on ambient noise. For example, if the system is in an office environment with minimum ambient noise, fan speed may be lowered to be less audible to the end user. In circumstances where the ambient noise is significant, fan speed can be ramped up to improve cooling of the platform. It is to be noted that the dock's effectiveness is dependent to a large degree on system design of the (detachable) device. For example, if a battery is placed at a center of the system to absorb heat generated by a system on a chip (SoC), thermal conductivity at edges of the device may be improved as compared with other battery placements. Docks with active cooling may be designed in conjunction with system design to enhance platform cooling for the specific device.

In another example, a hybrid outer plate design in which plastic is used around edges of the device and metal is used in interior portions, so that heat becomes less of a factor around the edges. Undocked refers to a system that is not currently placed in any dock and it is in a stand-alone mode.

Figure 2:
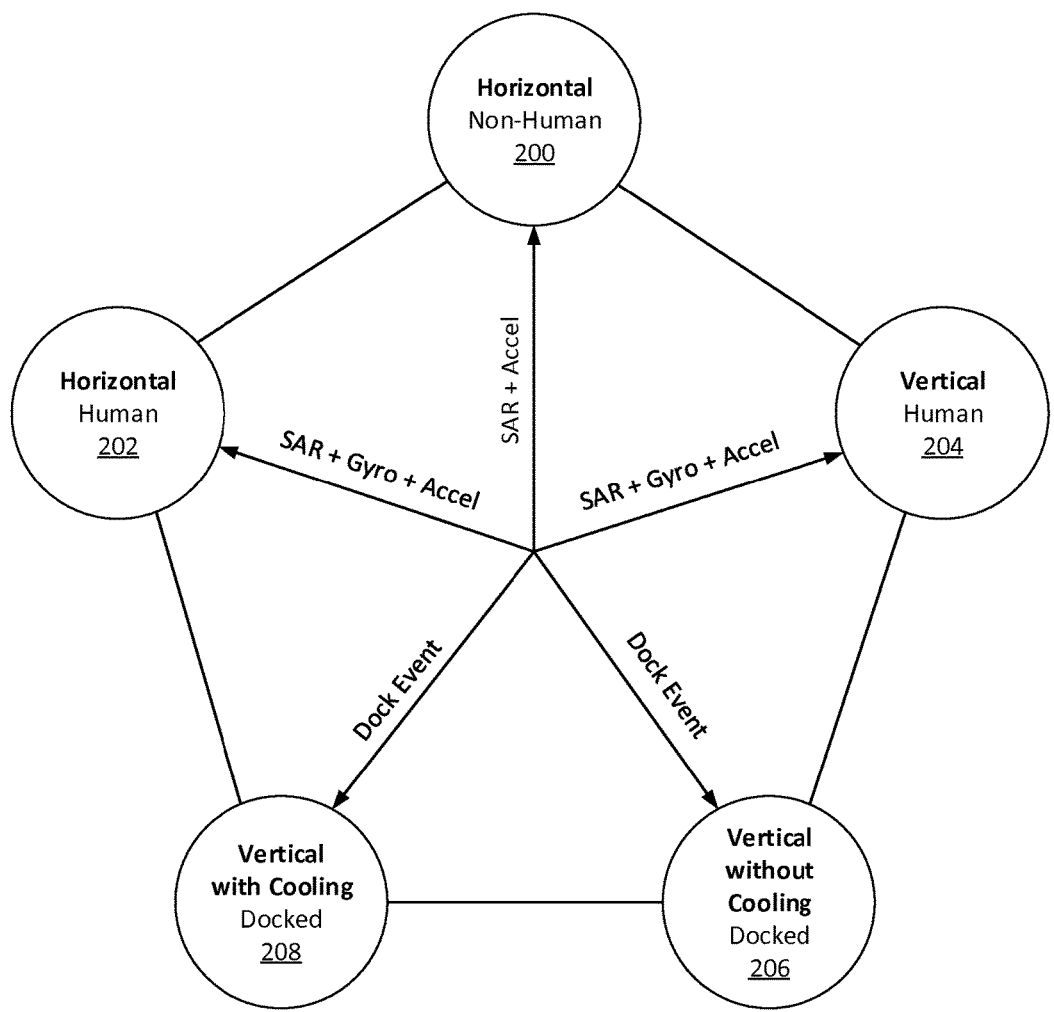
FIG. 2 is a diagram depicting states of a state machine, according to an embodiment of the present invention.

FIG. 2 is a diagram depicting states of a state machine, according to an embodiment of the present invention. A horizontal/non-human contact state 200 can be determined by system sensors, such as a SAR sensor and/or accelerometer data that provide information to PM logic. A horizontal/human contact state 202 can be determined by system sensors such as SAR, gyroscope, and/or accelerometer, providing information to the PM logic. A vertical/human contact state 204 can be determined by system sensors such as SAR, gyroscope, and/or accelerometer, providing information to the PM logic. A vertical/no active cooling (non-human contact) docked state 206 can be determined by a docking event that provides information to the PM logic. A vertical/active cooling docked state 208 can be determined by a docking event that provides information to the PM logic. Data provided by sensors may be received and transmitted through sensor and I/O (input/output) control logic e.g., the SICL 120 of FIG. 1.

Figure 3:
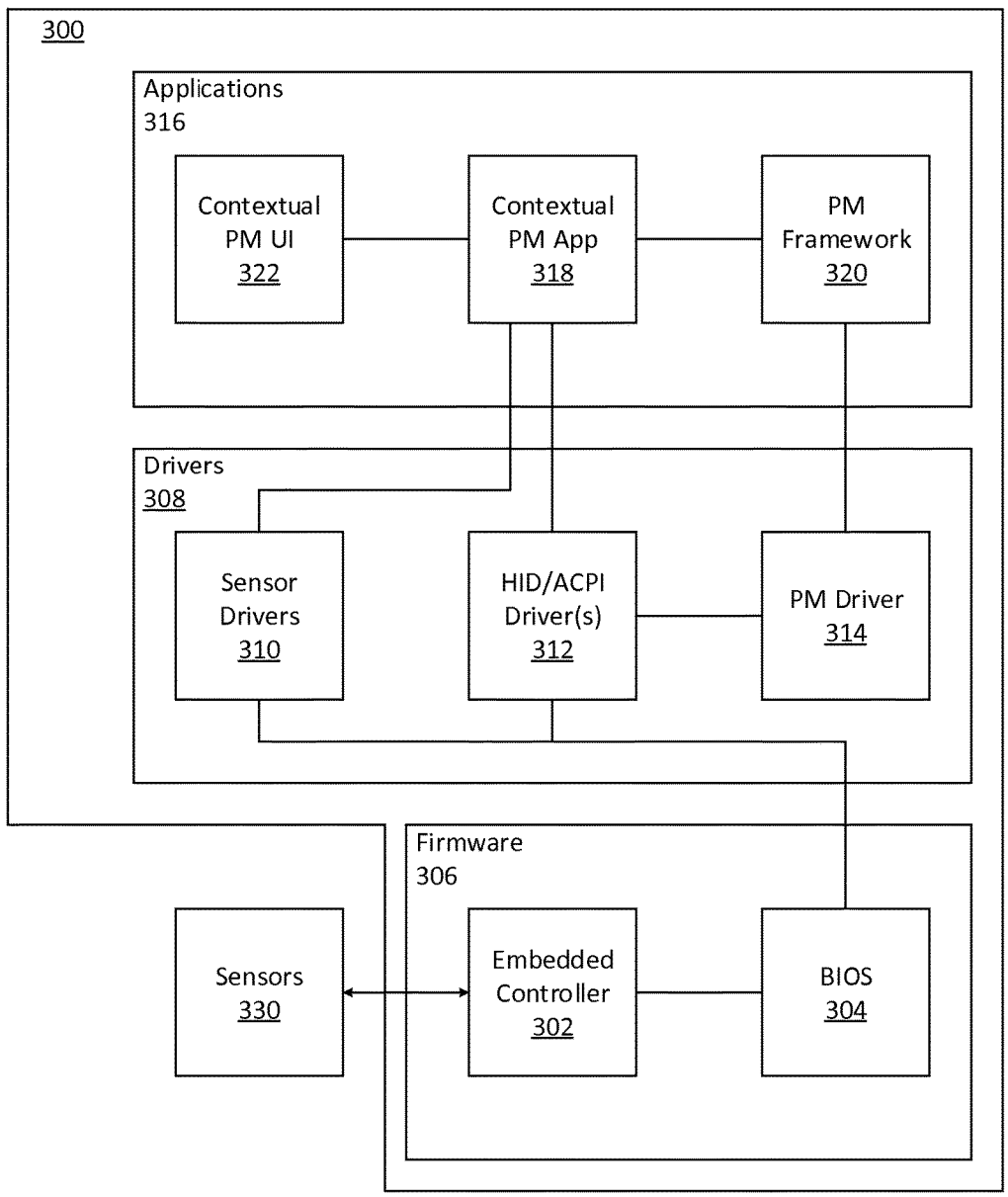
FIG. 3 is a block diagram of logic utilized to provide contextual information to power management logic of a device, according to an embodiment of the present invention.

FIG. 3 is a block diagram of logic utilized to provide contextual information to power management logic of a device, according to an embodiment of the present invention. Device sensors 330 may send sensor information input to logic 300, e.g., through a SICL (e.g., SICL 120 of FIG. 1), which in embodiments may include firmware logic 306 that includes an embedded controller 302 that may be configured through a basic input/output system (BIOS) 304. The sensor information is then sent to a driver layer 308 that may include sensor drivers 310, human interface device (HID)/Advanced Configuration and Power Interface (ACPI) drivers 312, and/or a power management driver 314. The driver layer 308 may notify an applications layer 316 registered for the input with the data from the sensors 330. Contextual PM application logic 318 may receive the sensor data to manage a state machine whose state depends on device context. The contextual PM application logic 318 may provide, to a PM framework 320, power state recommendations/instructions/commands for one or more components of the device, based on the device context that includes one or more parameters, e.g., whether the device is in physical contact with a human (e.g., user), orientation of the device, proximity to external air flow or other heat removing substances, speed of external air flow, etc. The PM framework 320 may adjust power supplied to the one or more components of the device based on the recommendations/instructions/commands received from the PM application logic 318. Additionally, a contextual PM user interface 322 may be user visible to present recommendations to a user from, e.g., the PM application logic 318, and to allow a user to manually change the PM policy. Additionally, the contextual PM user interface 322 may be operable to provide to the user an indication as to effectiveness in heat removal from the device of changes implemented by the user.

Figure 4:
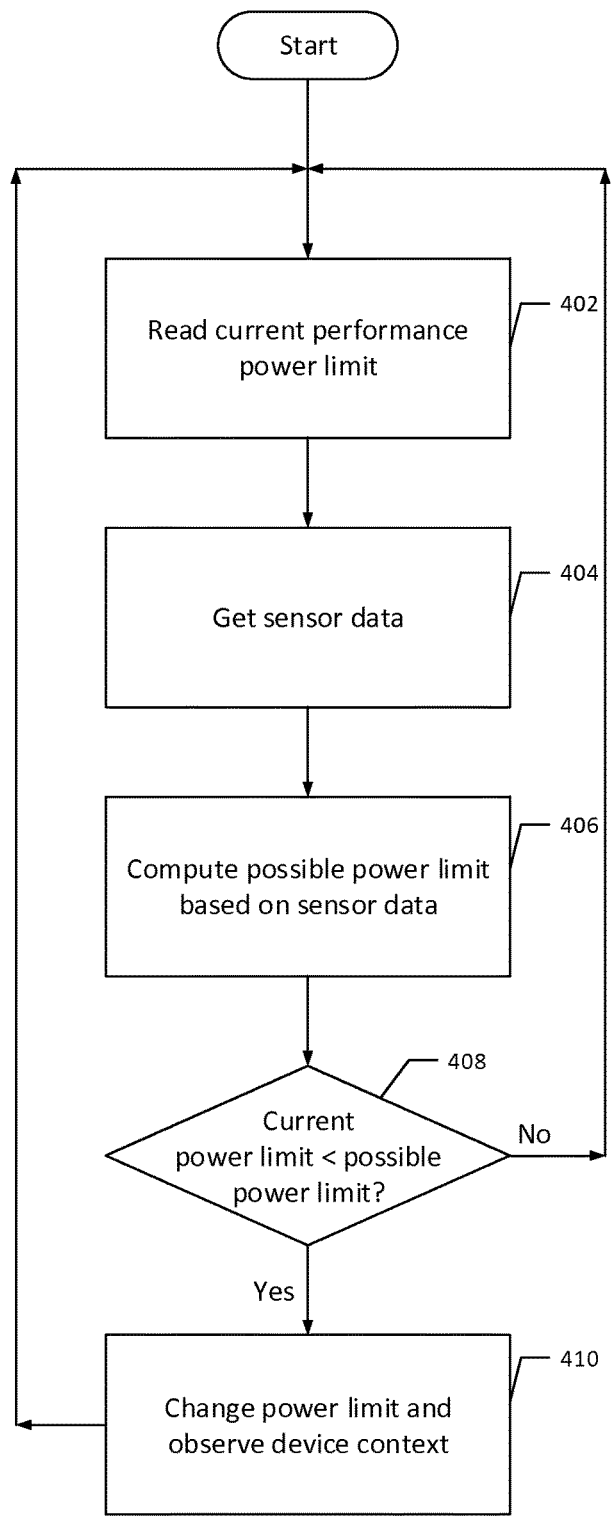
FIG. 4 is a flow diagram of a method including logic flow, according to an embodiment of the present invention.

FIG. 4 is a flow diagram of a method including logic flow, according to an embodiment of the present invention. Logic flow 400 may be managed by processing logic (such as the logic 300 described above), which can be one or more of hardware, software, and firmware logic.

At block 402, the processing logic reads a current performance power limit. Continuing to block 404, the processing logic retrieves sensor data, e.g., from one or more context sensors such as SAR, gyroscope, inclinometer, accelerometer, etc.

Advancing to block 406, the processing logic computes a possible power limit of the device based on the sensor data. Proceeding to decision block 408, processing logic determines whether a current computed power limit is less than the possible power limit. If the current power limit is not less than the possible power limit, the process returns to block 402. If the current power limit is less than the possible power limit, continuing to block 410 the processing logic changes the current power limit to an updated power limit (e.g., ≤the possible power limit) and returns to block 402. In some embodiments, the updated power limit specifies an updated $T_{skin}$.

In some embodiments, a contextual PM application can observe performance and battery life metrics corresponding to the application and system level components and can provide suggestions to end users regarding adjustments to improve performance/battery life. For example, a user may be holding a portable device horizontally and playing a game. The contextual PM application may determine that a horizontal orientation is not optimal for heat dissipation and may suggest to the user (e.g., via a user interface) that the user hold the system more vertically, or that the user place the system on a vertically oriented dock. In some embodiments, the suggestion may be presented in a non-intrusive fashion, e.g., a visual indicator on a taskbar that changes color (from green to yellow or to amber) to indicate that the device may be warmer in its current device context than if the device context were changed, e.g., by change of device orientation, or change of contact with the user, or introduction of active cooling. Such a visual indicator may influence the user to adjust one or more usage parameters (e.g., device orientation, contact with the user, external airflow or other external cooling) to improve device performance and/or battery life.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context The various elements of the device 102 as previously described with reference to the figures may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The foregoing examples and embodiments are set forth for purposes of illustration and not limitation. As such, other embodiments are described and claimed.

Additional embodiments are described below.

In a first example, an apparatus includes a processor including logic to determine, from data received from at least one sensor, whether the apparatus is in physical contact with a user. The logic is further to set a power management policy of the apparatus based on a processor context. The processor context is determined based at least in part on whether the apparatus is in physical contact with the user, and the power management policy is used by the logic to determine a level of power consumption at which to operate the processor.

A second example includes elements of the first example. Further, the data received includes orientation data associated with orientation of the apparatus, and the processor context is further determined based on the orientation of the apparatus.

A third example includes elements of the first example. The at least one sensor includes a specific absorption rate (SAR) sensor, and the logic is to determine whether the apparatus is in physical contact with the user based at least in part on the data received from the SAR sensor.

A fourth example includes elements of the first example. The at least one sensor includes an inclinometer, and the data includes a plurality of orientation measurements received from the inclinometer, each orientation measurement taken at a distinct time over a determined time period. The logic is to determine whether the apparatus is in physical contact with the user based at least in part on a comparison of a standard deviation of the orientation measurements, to a threshold standard deviation.

A fifth example includes elements of the first example and further includes a user interface. The logic is to provide to the user, via the user interface, a suggestion to improve at least one of processor performance and battery life based upon the processor context.

A sixth example includes elements of the first example. The logic is further to receive information that indicates whether the device is proximate to external airflow, and the logic is to determine the device context further based on whether the device is proximate to the external air flow.

A seventh example includes elements of the sixth example. Further, when the device is proximate to the external airflow, the logic is to provide, to a user, a recommendation regarding whether to adjust an airspeed of the external airflow with respect to the device based on the power management policy.

An eighth example includes elements of the first example. Additionally, the logic is to determine, based on the processor context, whether an adjustment of a usage parameter will increase a heat removal rate from the processor. The usage parameter is one of an apparatus orientation and physical contact with the user.

A ninth example includes elements of the eighth example. Additionally, the logic is to, responsive to a determination that the adjustment will increase the heat removal rate from the processor, provide a recommendation associated with the adjustment of the usage parameter to a user via a user interface.

A tenth example includes elements of any one of examples 1 to 3 and 5 to 9, where the at least one sensor includes at least one of a specific absorption rate (SAR) sensor, an accelerometer, a gyroscope, a compass, and an inclinometer. The logic is to determine whether the apparatus is in physical contact with the user based on data received from two or more sensors of the at least one sensor.

An eleventh example includes elements of any one of examples 1 to 3 and 5 to 9. Additionally, the data includes a plurality of measurements taken by a first sensor, each measurement taken at a distinct time over a determined time period. The logic is to determine whether the apparatus is in physical contact with the user based at least in part on a comparison of a standard deviation of the measurements to a threshold standard deviation.

A $12^{th}$ example is a method including determining, by a processor, whether a device that includes the processor is in physical contact with a user. setting, by the processor, a power management policy comprising a state machine by which to manage power consumption of the processor based at least in part on whether the device is in physical contact with the user.

A $13^{th}$ example includes elements of the $12^{th}$ example, and additionally includes determining, by the processor, a device context of the device, where the device context includes a first indication of whether the device is in physical contact with the user and a second indication of an orientation of the device with respect to a standard orientation. The method includes setting the power management policy based on the device context.

A $14^{th}$ example includes elements of the $12^{th}$ example, and further includes determining whether an adjustment of a usage parameter will increase removal of heat from the processor, and responsive to a determination that the adjustment of the usage parameter will increase a rate of heat removal from the processor, providing a recommendation associated with the adjustment to the user via a user interface. The usage parameter is one of an apparatus orientation, physical contact with the user, and airspeed of an external air flow proximate to the device.

A $15^{th}$ example includes elements of the $14^{th}$ example. Additionally, responsive to the adjustment of the usage parameter, the user interface is to provide to the user an indication of whether the rate of heat removal from the processor has increased from the rate of heat removal from the processor prior to the adjustment of the usage parameter.

A $16^{th}$ example includes elements of any one of examples 12 to 15 and further includes receiving data from at least two sensors selected from a specific absorption rate (SAR) sensor, an accelerometer, a gyroscope, a compass, and an inclinometer. Determining whether the apparatus is in physical contact with the user includes analyzing the data received from each of the at least two sensors.

A $17^{th}$ example includes elements of any one of examples 12 to 15, where the method includes setting the power management policy further based on whether the device is proximate to external air flow.

An $18^{th}$ example is an apparatus to perform the method of any one of examples 12 to 15.

A $19^{th}$ example is an apparatus that includes means for performing the method of any one of examples 12 to 15.

A $20^{th}$ example is a computer readable medium to store instructions that when executed by a computer, to cause the computer to determine, based on data received from one or more sensors, a first factor comprising whether a device is in physical contact with a human being, and to set a power management policy that at least partially determines power usage of the device. The power usage of the device is determined based at least in part the first factor.

A $21^{st}$ example includes elements of claim 20, and further includes instructions that when executed by the computer cause the computer to determine from the sensor data, at least one of a second factor comprising an orientation of the device with respect to a standard orientation and a third factor comprising an airspeed of airflow that is proximate to the device, and to set the power management policy further based on at least one of the second factor and the third factor.

A $22^{nd}$ example includes elements of the $21^{st}$ example, and further includes instructions to determine whether an adjustment of a usage parameter will increase removal of heat from the processor. Responsive to a determination that the adjustment will increase removal of heat from the processor, the instructions when executed by the computer cause the computer additionally to provide to the user via a user interface a recommendation associated with the adjustment. The usage parameter is associated with one of the first factor, the second factor, and the third factor.

A $23^{rd}$ example is a processor that includes at least one core and context power management logic to receive first sensor data during a first time period from a first sensor and second sensor data during the first time period from a second sensor that is distinct from the first sensor, to determine a state of a state machine based at least in part on the first sensor data and the second sensor data, and to provide a power state recommendation to power management logic based at least in part on the state of the state machine. The processor further includes power management logic to receive the power state recommendation, and to adjust an operational parameter of the processor based at least in part on the power state recommendation.

A $24^{th}$ example includes elements of the $23^{rd}$ example. Additionally, the first sensor data is associated with a first factor comprising whether the processor is in physical contact with a human being, and the second sensor data is associated with a second factor comprising an orientation of the processor with respect to an orientation standard.

A 25th example includes elements of the 24th example, and further includes a contextual power management user interface to provide to a user a recommendation to set a processor usage parameter based on the state of the state machine. The processor usage parameter is selected from the orientation of the processor, physical contact with the human being, and a relative flow speed of an external cooling agent with respect to the processor.

A 26th example includes elements of the 23rd example, where the operational parameter is a first clock speed of a first core of the at least one core.

A 27th example includes elements of the 23rd example. Further, the data is received periodically. Responsive to a difference between the first sensor data received in a first time frame and the first sensor data received in a second time frame, the context power management logic is to change the state of the state machine and to provide an updated power state recommendation to the power management logic.

A 28th example includes elements of the 23rd example. Additionally, the state of the state machine is based on whether the processor is docked to a dock that includes means for directing a coolant proximate to the processor.

A 29th example includes elements of any one of examples 23 to 28, where the first sensor includes at least one of a specific absorption rate (SAR) sensor, an accelerometer, a gyroscope, a compass, and an inclinometer, and where the logic is to determine whether the apparatus is in physical contact with the user based on the first sensor data.

30th example includes elements of any one of examples 23 to 28, where the second sensor includes an inclinometer to measure an orientation of the processor with respect to an orientation standard.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a processor including logic to:
determine, from sensor data received from at least one sensor, whether the apparatus is in a first orientation and is in physical contact with a user;
in response to a determination that the apparatus is in the first orientation and is in physical contact with the user:
determine, based on the sensor data, whether an adjustment of the apparatus to a second orientation will increase a heat removal rate from the processor; and
in response to a determination that the adjustment of the apparatus to the second orientation will increase the heat removal rate from the processor, provide, via a user interface, a recommendation for the user to adjust the apparatus to the second orientation.

2. The apparatus of claim 1, wherein the data received includes orientation data associated with orientation of the apparatus, wherein the logic is to determine the operating speed of the processor at least partially based on the orientation of the apparatus.

3. The apparatus of claim 1, wherein the at least one sensor includes a specific absorption rate (SAR) sensor, wherein the logic is to determine whether the apparatus is in physical contact with the user based at least in part on the data received from the SAR sensor.

4. The apparatus of claim 1, wherein the at least one sensor includes an inclinometer, wherein the data includes a plurality of orientation measurements received from the inclinometer, each orientation measurement taken at a distinct time over a determined time period, and wherein the logic is to determine whether the apparatus is in physical contact with the user based at least in part on a comparison of a standard deviation of the orientation measurements, to a threshold standard deviation.

5. The apparatus of claim 1, wherein the logic is further to receive information that indicates whether the apparatus is proximate to external airflow, and wherein the logic is to determine the operating speed of the processor at least partially based on whether the apparatus is proximate to the external air flow.

6. The apparatus of claim 5, wherein when the apparatus is proximate to the external airflow, the logic is to provide, to the user, a recommendation regarding whether to adjust an airspeed of the external airflow with respect to the apparatus.

7. The apparatus of claim 1, wherein the at least one sensor includes at least one of a specific absorption rate (SAR) sensor, an accelerometer, a gyroscope, a compass, and an inclinometer, wherein the logic is to determine whether the apparatus is in physical contact with the user based on data received from two or more sensors of the at least one sensor.

8. The apparatus of claim 1, wherein the data includes a plurality of measurements taken by a first sensor, each measurement taken at a distinct time over a determined time period, and wherein the logic is to determine whether the apparatus is in physical contact with the user based at least in part on a comparison of a standard deviation of the measurements to a threshold standard deviation.

9. The apparatus of claim 1, wherein the logic is further to increase the operating speed of the processor responsive to a determination that the apparatus is not in physical contact with the user.

10. The apparatus of claim 1, wherein the first orientation is a horizontal orientation, and wherein the second orientation is a vertical orientation.

11. A method comprising:
determining, by a processor, whether a device that includes the processor is in a first orientation and is in physical contact with a user; and
in response to a determination that the device is in the first orientation and is in physical contact with the user:
determining whether an adjustment of the device to a second orientation will increase a heat removal rate from the processor; and
in response to a determination that the adjustment of the device to the second orientation will increase the heat removal rate from the processor, providing, via a user interface, a recommendation for the user to adjust the device to the second orientation.

12. The method of claim 11, further comprising:
in response to a determination that the device is not in physical contact with the user, increasing an operating speed of the processor.

13. The method of claim 12, further comprising determining the operating speed of the processor at least partially based on an orientation of the device.

14. The method of claim 12, further comprising determining the operating speed of the processor at least partially based on whether the device is proximate to external air flow.

15. The method of claim 11, further comprising:
in response to a determination that the device is in physical contact with the user, decreasing the operating speed of the processor.

16. The method of claim 11, wherein the first orientation is a horizontal orientation, and wherein the second orientation is a vertical orientation.

17. A non-transitory computer readable medium to store instructions that when executed by a computer, to cause the computer to:
determine, based on data received from one or more sensors, whether a device is in a first orientation and is in physical contact with a user;
in response to a determination that the device is in the first orientation and is in physical contact with the user:
determine, based on the sensor data, whether an adjustment of the device to a second orientation will increase a heat removal rate from the device; and
in response to a determination that the adjustment of the device to the second orientation will increase the heat removal rate from the device, provide, via a user interface, a recommendation for the user to adjust the device to the second orientation.

18. The non-transitory computer readable medium of claim 17, further comprising instructions that when executed by the computer cause the computer to determine, from the sensor data, an airspeed of airflow that is proximate to the device, and to set a power usage of the device based on the orientation of the device and the airspeed of the airflow.

19. The non-transitory computer readable medium of claim 17, further comprising instructions to:
reduce a power usage of the device responsive to a determination that the device is in physical contact with the user; and
increase the power usage of the device responsive to a determination that the device is not in physical contact with the user.

20. The non-transitory computer readable medium of claim 17, wherein the first orientation is a horizontal orientation, and wherein the second orientation is a vertical orientation.

* * * * *